US011594439B2

(12) United States Patent
Schneider et al.

(10) Patent No.: US 11,594,439 B2
(45) Date of Patent: Feb. 28, 2023

(54) FRAME CASSETTE FOR HOLDING TAPE-FRAMES

(71) Applicant: Infineon Technologies AG, Neubiberg (DE)

(72) Inventors: Germar Schneider, Dresden (DE); Matthias Taubert, Radebeul (DE); Michael Mitrach, Dresden (DE); Thomas Gadau, Dresden (DE); Markus Pfeifenberger, Metnitz (AT); Walter Leitgeb, Wernberg (AT); Frank Boenewitz, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 822 days.

(21) Appl. No.: 16/009,843

(22) Filed: Jun. 15, 2018

(65) Prior Publication Data

US 2018/0308721 A1    Oct. 25, 2018

Related U.S. Application Data

(63) Continuation of application No. 15/006,154, filed on Jan. 26, 2016, now Pat. No. 10,020,215, which is a
(Continued)

(51) Int. Cl.
*H01L 21/677* (2006.01)
*H01L 21/673* (2006.01)
*H01L 21/67* (2006.01)

(52) U.S. Cl.
CPC .... *H01L 21/6773* (2013.01); *H01L 21/67161* (2013.01); *H01L 21/67373* (2013.01);
(Continued)

(58) Field of Classification Search
CPC ............ B65G 1/0407; H01L 21/67772; H01L 21/67386
(Continued)

(56) References Cited

U.S. PATENT DOCUMENTS 5,469,963 A * 11/1995 Bonora ................. G03F 1/66
206/454
6,119,865 A    9/2000 Kawada
(Continued)

FOREIGN PATENT DOCUMENTS

CN    1897851 A    1/2007
CN    101443244 A    5/2009
(Continued)

OTHER PUBLICATIONS

"Film Frame Carrier, Magazine 300 mm 13 Slot", Powatec, Product Information, Accessed online Jun. 15, 2018 at http://powatec.com/fileadmin/user_upload/pdfs/Powatec_FilmFrameCarrierMagazine300mm.pdf.
(Continued)

*Primary Examiner* — Saul Rodriguez
*Assistant Examiner* — Willie Berry, Jr.
(74) *Attorney, Agent, or Firm* — Murphy, Bilak & Homiller, PLLC (57) ABSTRACT

According to various embodiments, a frame cassette includes a housing and a mounting structure within the housing. The mounting structure includes a plurality of tape-frame slots, each tape-frame slot configured to receive a tape-frame. The housing includes an opening configured to introduce a tape-frame into a tape-frame slot of the plurality of tape-frame slots, or to remove the tape frame from the tape-frame slot of the plurality of tape-frame slots. The housing also includes an electrostatic discharge protection. A corresponding automatic transportation system and method of automatic transportation of semiconductor wafers is also provided.

22 Claims, 10 Drawing Sheets

Related U.S. Application Data continuation of application No. 14/168,056, filed on Jan. 30, 2014, now abandoned.

(52) U.S. Cl.
CPC .. *H01L 21/67376* (2013.01); *H01L 21/67379* (2013.01); *H01L 21/67383* (2013.01); *H01L 21/67389* (2013.01); *H01L 21/67396* (2013.01); *H01L 21/67733* (2013.01)

(58) Field of Classification Search
USPC ........ 414/281, 411, 937, 940; 206/710, 711, 206/832; 211/41.18
See application file for complete search history.

(56) References Cited

U.S. PATENT DOCUMENTS

| | | |
|---|---|---|
| 6,776,289 B1 | 8/2004 | Nyseth |
| 2002/0114686 A1 | 8/2002 | Glynn et al. |
| 2005/0109669 A1 | 5/2005 | Burns et al. |
| 2005/0115866 A1 | 6/2005 | Burns et al. |
| 2009/0035099 A1 | 2/2009 | Okabe et al. |
| 2009/0206001 A1 | 8/2009 | Sasaki et al. |
| 2011/0100870 A1 | 5/2011 | Ohnuki et al. |
| 2011/0215028 A1 | 9/2011 | Igarashi et al. |
| 2013/0051966 A1 | 2/2013 | Kim et al. |
| 2013/0216336 A1 | 8/2013 | Lee et al. |
| 2014/0178162 A1* | 6/2014 | Morikawa ......... H01L 21/67772 414/416.08 |

FOREIGN PATENT DOCUMENTS

| | | |
|---|---|---|
| KR | 20090028973 A | 3/2009 |
| TW | 200524797 A | 8/2005 |

OTHER PUBLICATIONS

"Film Frame Carrier, Magazine 300 mm 25 Slot", Powatec, Product Information, Accessed online Jun. 15, 2018 at http://powatec.com/fileadmin/user_upload/pdfs/Powatec_FilmFrameCarrierMagazine300mm-25.pdf.

* cited by examiner

FRAME CASSETTE FOR HOLDING TAPE-FRAMES

TECHNICAL FIELD

Various embodiments relate generally to a frame cassette.

BACKGROUND

Generally, a wafer may be handled via a so-called tape-frame during one or more processes in semiconductor industry, e.g. during dicing processes. The wafer handling via a tape-frame may include adhering the wafer to a tape and stabilizing the tape via a tape-frame. In a dicing process, for example, a wafer may be mounted on a so-called dicing tape which has a sticky surface fixing the wafer, wherein the dicing tape may be adhered to a tape-frame, e.g. a metal frame or a plastic frame. A tape-frame may also be referred to as wafer-frame, dicing ring, metal film frame, or wafer ring. A tape may also be referred to as dicing tape, wafer tape, or back grinding tape. In general, the wafer handling using tapes and tape-frames may be performed in a so-called frame cassette in the back-end of line (BEOL), e.g. for wafer dicing processes, die-bonding process, for shipping, handling, and/or storage. Thereby, the frame cassette may be transported for example manually, e.g. via a human handle at the frame cassette.

SUMMARY

According to various embodiments, a frame cassette may include: a housing; a mounting structure inserted in the housing, the mounting structure including a plurality of tape-frame slots, wherein each tape-frame slot is configured to receive a tape-frame, wherein the housing includes an opening to introduce a tape-frame into a tape-frame slot of the plurality of tape-frame slots or to remove a tape-frame from a tape-frame slot of the plurality of tape-frame slots, and a door mounted at the housing, wherein the door is configured to close the opening of the housing to seal the interior of the housing from the exterior of the housing.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

During semiconductor wafer processing, e.g. during processing wafers with sizes of 100 mm up to 450 mm (with special focus on 300 mm) for power semiconductor applications, laminating and sawing processes may be necessary. Thereby, the wafers may be laminated on tapes already during the classical front-end of line (FEOL) processing and subsequently the tapes may be mounted on tape-frames, e.g. via a so-called wafer mounter, frame mounter, or wafer frame mounter provided for example by (e.g. commercially available from Disco, Lintec, Long Hill, and other companies). Further, one or more tape-frames may be handled in a frame cassette. Commonly used frame cassettes are open containers (e.g. commercially available from Powatec) and are manually placed on load ports of manufacturing devices (e.g. manufacturing tools or equipment) in semiconductor factories. One aspect of various embodiments can be seen in providing a frame cassette for fully automated handling of tape-frames and thin wafers in the FEOL processing.

The requirements of commonly used frame cassettes may result from their present application in the back-end of line processing, e.g. under cleanroom conditions from ISO-class 7 to ISO-class 9. In contrast, another aspect of various embodiments can be seen in providing a frame cassette for fully automated handling of wafer frames in a front-end of line processing, e.g. under cleanroom conditions from ISO-class 2 to ISO-class 6.

According to various embodiments, the frame cassette provided herein may allow a wafer processing via tape-frames under cleanroom conditions cleaner than ISO-class 7, e.g. during lamination processes and dicing processes being for example part of the FEOL processing. Therefore, a frame cassette may be provided which can be sealed easily to maintain cleanroom conditions inside the frame cassette (e.g. during processing of the wafers) or to provide cleanroom conditions inside the frame cassette (e.g. for storage).

Illustratively, an aspect of various embodiments can be seen in integrating the wafer-tape-frame handling into a fully automated cleanroom system as used in the FEOL processing, e.g. integrating the wafer-tape-frame handling into currently used overhead transportation systems and automated wafer handling systems. This may allow the processing of thin wafers or ultra-thin wafers in frame cassettes with a reduced loss due to contamination of the wafers (e.g. the accumulation of particles on the wafer surface may otherwise reduce the functionality of the manufactured integrated circuits), which may be necessary for example for a long dwell time of the frame cassette in the cleanroom (or factory). Further, integrating the frame cassette handling into a fully automated processing may increase the yield due to shorter production times.

Further, the increasing use of thin wafers or ultra-thin wafers having a thickness in the range from about 2 µm to about 400 µm may create the need for wafer handling using tapes and accordingly tape-frames.

According to various embodiments, a frame cassette may be provided for handling one or more wafers respectively mounted on a tape-frame during the processing, the wafers including for example electronic circuits or integrated circuits for manufacturing silicon based chips (or e.g. microchips) or chips based on another semiconductor material, e.g. gallium nitride, gallium arsenide, silicon carbide, wherein the frame cassette can be sealed such that the wafer is protected from being contaminated with dust or particles (or other contaminations, e.g. protected from the adsorption of water, or chemically protected from oxidation, and the like) during the handling.

According to various embodiments, a frame cassette may be provided for handling one or more wafers respectively mounted on a tape-frame during the processing, wherein the frame cassette may be configured to match to a fully automated transport system, e.g. to an overhead transport system.

Illustratively, the commonly manually transported open frame cassettes may be configured to be automatically handled under cleanroom conditions of the FEOL processing, e.g. ISO-class smaller than 7.

Further, the frame cassette may include the necessary standards, e.g. SEMI® standard G77 for frame cassettes, or the frame cassette may be configured to match the SEMI® standards G82, E64 (the release of 1997 and/or subsequent editions, e.g. SEMI E64-1105 (Reapproved 0512) or later), E57, E15 (the release of 1990 and/or subsequent editions, e.g. SEMI E15-0698E2 (Reapproved 0310) or later), and/or E15.1 for load ports and tools in the front-end and back-end of line processing. Further, the frame cassette may be configured to match the SEMI® standards G74 (the release of 1998 and/or subsequent editions, e.g. SEMI G74-0699 (Reapproved 0706) or later) or G88 (e.g. SEMI G88-0211 or later) for tape-frames for 100 mm up to 450 mm wafers.

According to various embodiments, the frame cassette may include a body which can be sealed via a door and may include the respective materials enabling the use of the frame cassette under cleanroom conditions with ISO-class 2 (e.g. for manufacturing CMOS technology with feature size smaller than 0.65 µm), ISO-class 3, ISO-class 4, ISO-class 5, ISO-class 6 (e.g. for manufacturing power electronics).

According to various embodiments, the frame cassette may be configured to be handled via a fully automated loading and unloading system (AMHS, automated material handling system). Therefore, the frame cassette may be configured to be landed on a tool via an automated transport system (e.g. an overhead transport system). Further, the frame cassette may be configured such that the door of the frame cassette can be opened (e.g. controlled by the tool or by the transport system) and such that the tape-frames can be loaded into the frame cassette or unloaded from the frame cassette, as illustrated for example in FIG. 5 including the reference on essential SEMI® standards for the placement of a container to a process equipment.

The SEMI® standards E47.1, E1.9, E15.1, E57, and E63 may be considered in the design of the frame cassette, wherein these standards may concern the interfaces, which may be essentially required for recognizing and opening the containers (e.g. the frame cassette). Another SEMI® standard considered in the design of the frame cassette may concern the interface to the overhead transport system (OHT), which may include for example an infrared interface. Further, SEMI® standard E84 may be considered in the design of the frame cassette, wherein this standard may concern the automatically positioning of the frame cassette on the equipment or tool via the OHT. Further, SEMI® standard E87 may be considered for the connections for data exchange (SECS/GEM).

According to various embodiments, the frame cassette may comply with SEMI® standards as referred to herein (respectively in the original release and subsequent editions), e.g. such that an automated transport of the frame cassette can take place:

SEMI® standard E84 (e.g. the release of 1999 and/or subsequent editions, e.g. SEMI E84-1109 or later): Specification for carrier interface control for fully automatic transport.

SEMI® standard E47.1 (e.g. the release of 1997 and/or subsequent editions, e.g. SEMI E47.1-1106 (Reapproved 0512) or later): Mechanical specification for containers and for storage of containers.

SEMI® standard E1.9 (e.g. the release of 1994 and/or subsequent editions, e.g. SEMI E1.9-1106E (Reapproved 0512) or later): Mechanical specification for container transport and storage for 300 mm wafer for automatic transport and all necessary dimensions for optical parts, information flows, identification, and correct positioning.

SEMI® standard E15.1 (e.g. the release of 1996 and/or subsequent editions, e.g. SEMI E15.1-0305 (Reapproved 1110) or later): Specification for 300 mm loading systems which ensures the requirements to the dimensions of the load units of the process equipment, such as ID-read devices but also mechanical interfaces for the pins of the load units.

SEMI® standard E57 (e.g. the release of 1996 and/or subsequent editions, e.g. SEMI E57-0600 (Reapproved 1110) or later): Specification of the kinematic coupling which is required for proper placement of the wafer containers, transport cassettes, quartz boats and other aids.

SEMI® standard E63 (e.g. the release of 1997 and/or subsequent editions, e.g. SEMI E63-1104 (Reapproved 1110) or later): Mechanical specification for 300 mm opener, tool standards, mechanical interfaces to process systems, mechanical interfaces to control systems, and storage capacity of the container.

SEMI® standard G77 (e.g. the release of 1999 and/or subsequent editions, e.g. SEMI G77-0699 (Reapproved 0706) or later): Specification of mechanical components for 300 mm wafer cassettes, e.g. for assembly processes.

SEMI® standard G82 (e.g. the release of 2001 and/or subsequent editions, e.g. SEMI G82-0301E (Reapproved 0706) or later): Specification for 300 mm wafer cassettes for the load ports, e.g. in the final assembly process.

Deviations from these specifications may require adaptations and/or other measures to match the frame cassette to the OHT and/or to the AMHS.

According to various embodiments, the frame cassette may be transported fully automatically, for example a frame cassette may host 25 wafers respectively mounted on tape-frames, wherein the frame cassette may be transported via a host system. Thereby, the frame cassettes may be transported with transport vehicle on the ceiling of the factory and the frame cassettes may be placed on the equipment via the host system. Such transport systems may be commercially available for example from Muratec, Daifuku, and Dainichi.

Alternatively, the frame cassette may be transported via a robotic system which can move freely through the cleanroom (e.g. an AGV, automatic guided vehicle) or which can move on a rail such that the frame cassettes may be transported to an equipment or to a processing tool and away from an equipment or from a processing tool.

According to various embodiments, the frame cassette may be configured to receive tape-frames being suitable for the use with 300 mm wafers (or other wafer sizes), e.g. metal tape-frames or plastic tape-frames, such that the wafers can be transported without being damaged and such that the wafers may maintain free from contaminations during processing which might reduce the functionality or properties of the product. According to various embodiments, the frame cassette may be configured to receive tape-frames suitable for the use with 100 mm wafers, 150 mm wafers, 200 mm wafers, 300 mm wafers, 450 mm wafers, or even larger wafers if available. Further, according to various embodiments, the frame cassette may be configured to receive tape-frames for carrying wafer for solar industry, medical industry, LED industry, and other possible industrial branches, where laminated wafer may be transported via tape-frames.

According to various embodiments, the frame cassette may meet at least the requirements of ISO-class 7 or better. According to various embodiments, the frame cassette may meet the requirements of ISO-class 6. For manufacturing wafers including feature sizes smaller than 90 nm the frame cassette may meet at least the requirements of ISO-class 2.

According to various embodiments, the frame cassette may chemically inert. Illustratively, the frame cassette may include a plastic material used in the integrated circuit manufacturing. The frame cassette may not emit or produce particles or dust (e.g. the metals and ions may be smaller than $50\times10$ E10 at/cm$^2$ determined via X-ray fluorescence spectroscopy).

According to various embodiments, the frame cassette may be sealed air-tight or may be configured to be sealed air-tight. In this case, the frame cassette may be filled with an inert gas (e.g. $N_2$, Ar, He, and the like) or dry air. Therefore, the frame cassette may be used for long term storage of the wafers mounted on the tape-frames. Further, according to various embodiments, the frame cassette may include a valve structure for purging, evacuating, and/or venting of the sealed frame cassette.

According to various embodiments, the frame cassette may include a door for sealing the frame cassette, wherein the frame cassette may include a gasket (e.g. a form-fitting gasket) partially embedded into the body or housing of the frame cassette. Further, the door may include a locking mechanism for manually and automatically opening the door, e.g. according to SEMI® standards. According to various embodiments, the door of the frame cassette may be designed double-walled, so that during automatic or manual operating of the locking mechanism particles may not enter the sealed frame cassette.

According to various embodiments, the dimensions of the frame cassette may be defined by the overall dimensions, which in turn result from the dimensions for 25 tape-frames being for example received in the frame cassette, wherein the tape-frames may have for example a distance of about 10 mm between each other.

The docking system to operate the door may be adapted to the door dimensions and the forces required to open and close the door, e.g. according to the SEMI® standard. According to various embodiments, the door of the frame cassette may be configured to be operated by the docking system of the manufacturing tool, wherein the door may include for example one or more (e.g. two) positioning holes, one or more (e.g. two) circular vacuum suction surfaces and one or more (e.g. two) rectangular rotary opener connections on the outer side of the door, e.g. according to the SEMI® standard.

Alternatively, the door may be opened via a shifting mechanism moving the door vertically to open the frame cassette. The opening mechanism shifting the door may be controlled by a respectively adapted load port and may be configured to be self-locking when the door is closed and the frame cassette is thereby sealed.

According to various embodiments, the frame cassette may be configured in accordance with the SEMI® standards to couple the frame cassette to the respective manufacturing tools. According to various embodiments, the frame cassette may be configured to avoid damaging the wafer mounted in the tape-frames during wafer/tape-frame handling (e.g. max. one wafer break during 100 000 handlings).

According to various embodiments, the frame cassette may be configured to be operated (accuracy >99.9%) via an AMHS (Automated Material Handling System) or an automated handling system.

According to various embodiments, the frame cassette may be ESD protected or may include an ESD protection (ESD, electrostatic discharge).

According to various embodiments, the frame cassette may include a robotic handling flange (a so-called mushroom head) to be transported via a host system.

According to various embodiments, the frame cassette may be operated (e.g. transported, placed, positioned) via a robotic system or a mobile vehicle (e.g. a roller conveyor), wherein the frame cassette may include an interface or a pick-up location (e.g. bottom rails) such that the frame cassette can be coupled to the robotic system or the mobile vehicle.

According to various embodiments, the frame cassette may include one or more RFID-tags (RFID, radio-frequency identification), such that the frame cassette may be identified within the fully automatic transport system.

According to various embodiments, to provide the necessary ESD properties, the frame cassette may include dielectric materials avoiding electrical breakdowns.

According to various embodiments, the frame cassette may include a body (housing) in rectangle shape, wherein the body may be formed of a metal, a plastic material, or a combination of metal and plastic material. Further, according to various embodiments, the body may have a hexagonal shape or any other suitable shape, e.g. a partially cylindrical shape or a prismatic shape.

According to various embodiments, the frame cassette may include human handles, e.g. for manual transport of the frame cassette by an operator in sustaining mode.

According to various embodiments, the frame cassette may include a door with a crank mechanism and two rotation locks according to the SEMI® standard for manually and/or automatically opening the door.

Figure 1A:
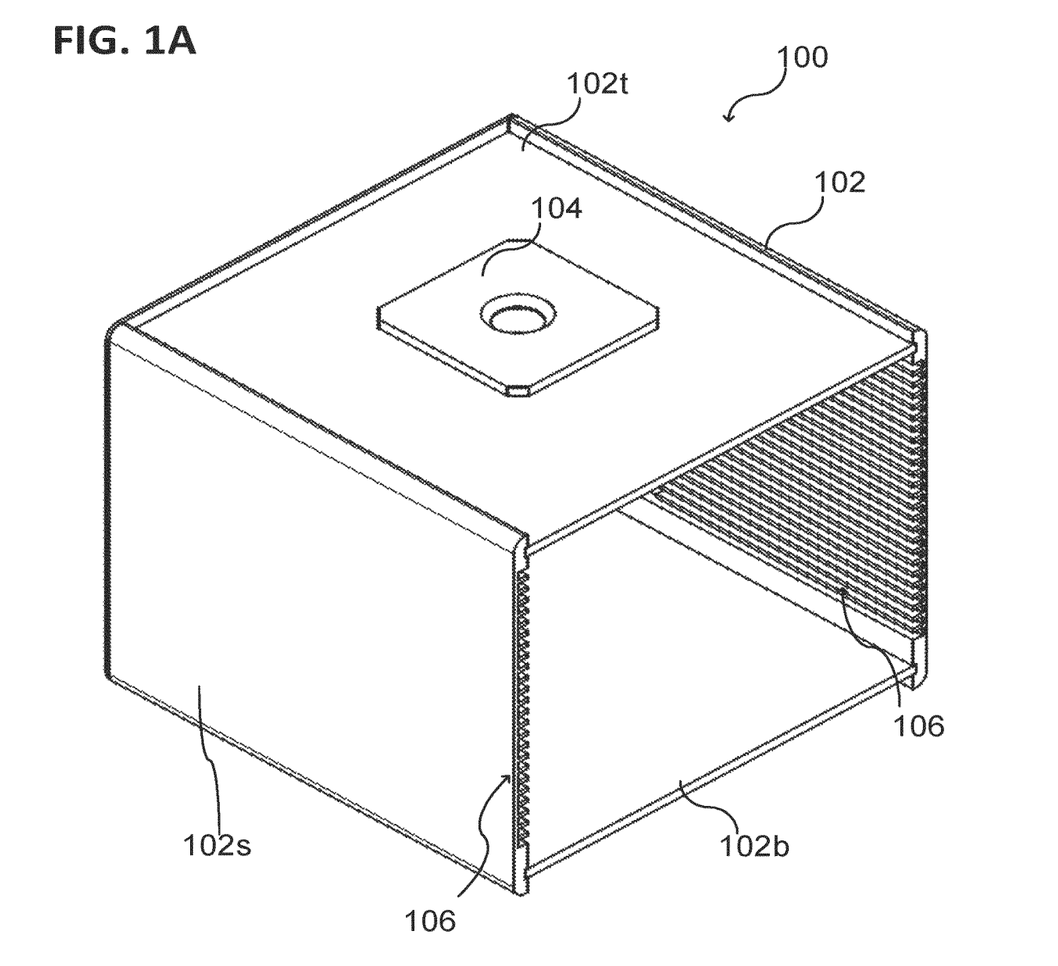
FIGS. 1A to 1C show respectively a frame cassette in a schematic perspective view from above, according to various embodiments.
Figure 1B:
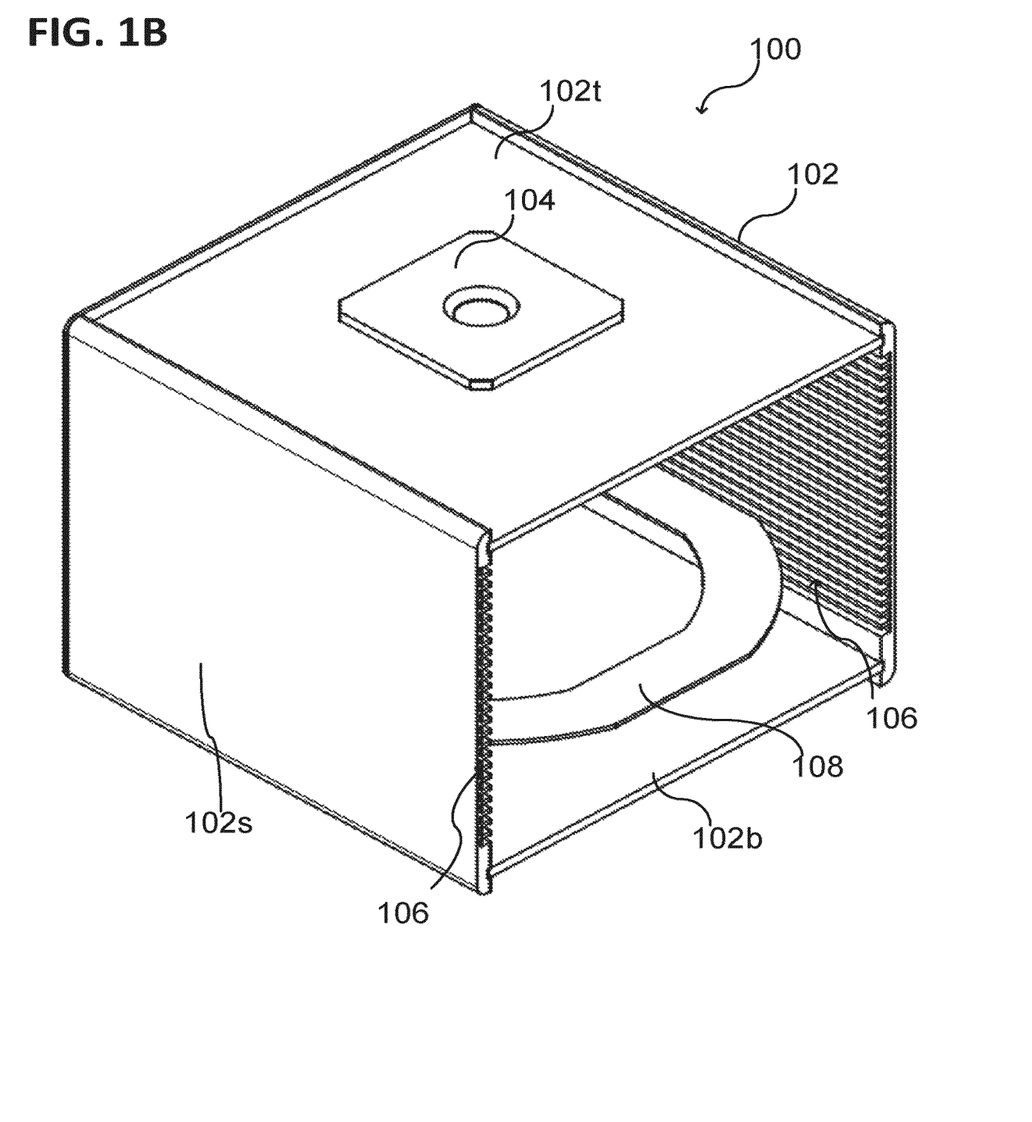
Figure 1C:
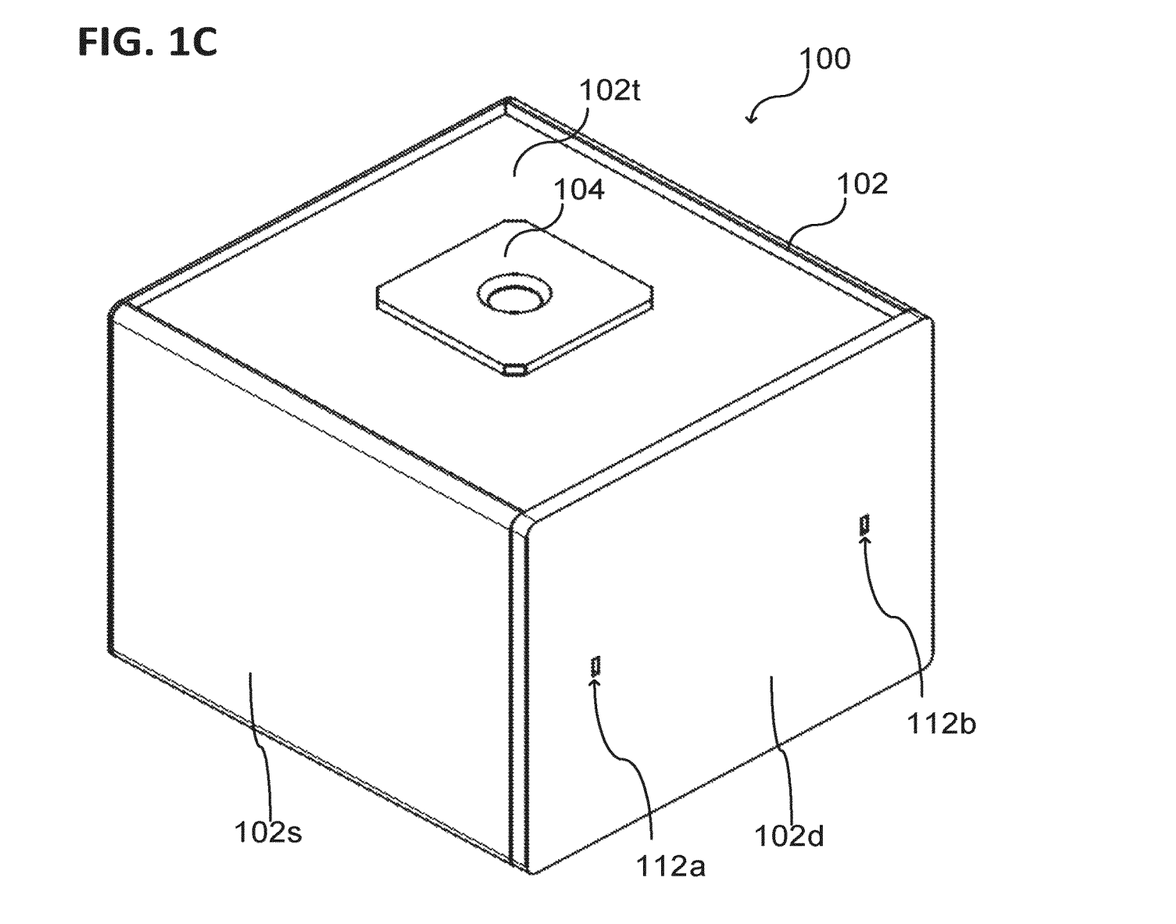
Figure 3A:
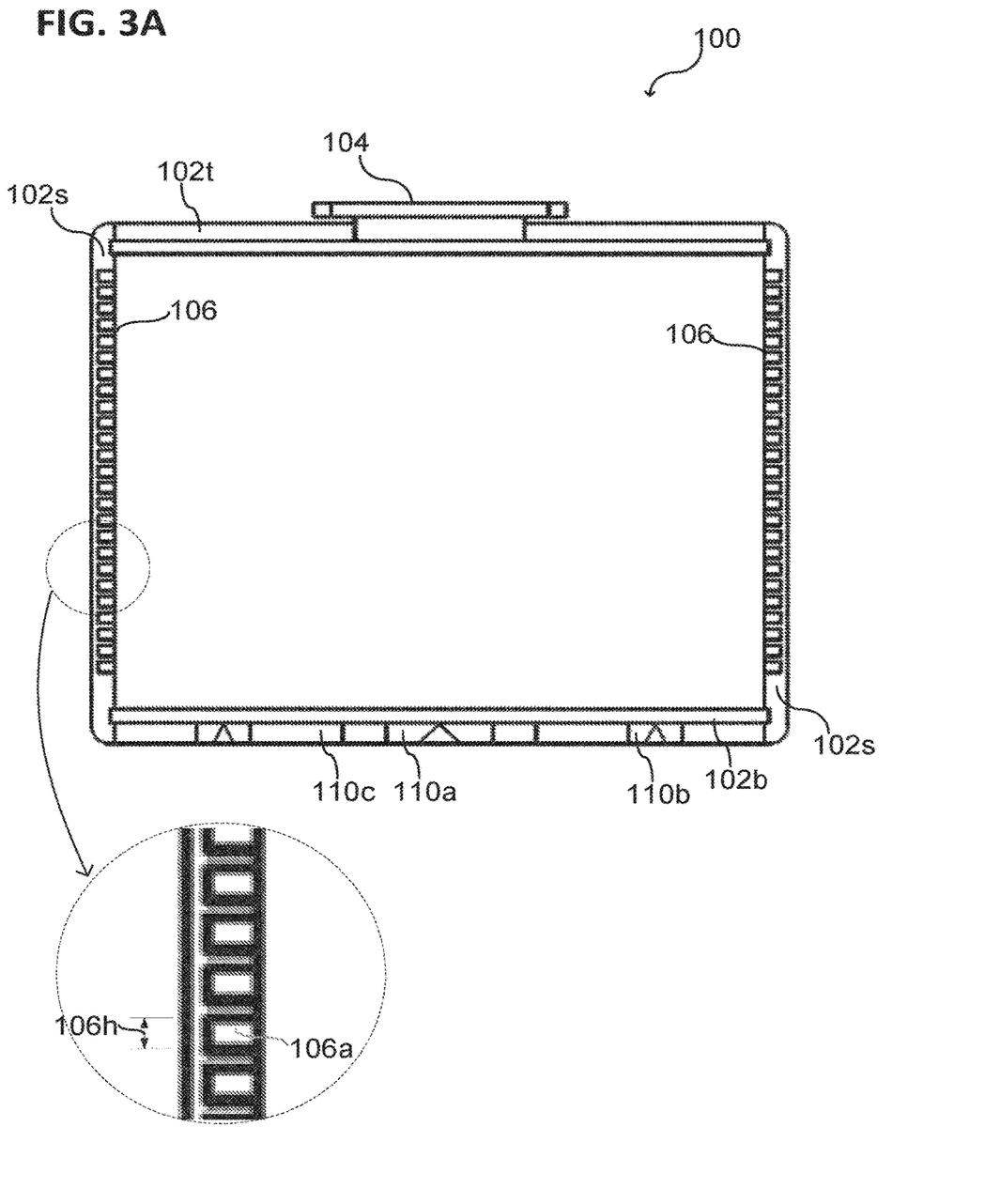
FIGS. 3A and 3B show respectively a frame cassette in a schematic view from the front, according to various embodiments.

As shown in FIG. 1A, a frame cassette 100 may include: a housing 102 (or a body), a mounting structure 106 within the housing 102, wherein the mounting structure 106 includes a plurality of tape-frame slots 106a (c.f. FIG. 3A), each tape-frame slot 106a being configured to receive a tape-frame 108 (c.f. FIG. 1B), wherein the housing 102 include an opening to introduce a tape-frame 108 into a tape-frame slot of the plurality of tape-frame slots 106a or to remove a tape-frame 108 from a tape-frame slot of the plurality of tape-frame slots 106a, a door 102d mounted at the housing or mountable at the housing (c.f. FIG. 1C); wherein the door 102 is configured to close the opening of the housing 102 to seal the interior of the housing from the exterior of the housing.

According to various embodiments, the frame cassette 100 may include a top cover 102*t* and a bottom plate 102*b*, defining for example the shape of the housing 102. The top cover 102*t* and the bottom plate 102*b* may have for example a quadratic shape, a rectangular shape, a hexagonal shape, or the like. Further, the housing 102 may include for example rounded corners, so that the housing 102 may have substantially a prismatic (e.g. cubic or cuboidal) shape with rounded corners.

According to various embodiments, the housing 102 of the frame cassette 100 may include three side covers 102*s*, or more than three side covers, e.g. five or more than five side covers. Illustratively, the top cover 102*t*, the bottom plate 102*b* and the side covers 102*s* may have any desired shape (e.g. plate-shaped) forming the housing 102. Further, the top cover 102*t*, the bottom plate 102*b* and the side covers 102*s* may include or may consist of a metal, e.g. aluminum, e.g. steel, or another metal suitable to provide the housing 102. Further, according to various embodiments, the top cover 102*t*, the bottom plate 102*b* and the side covers 102*s* may include or may consist of a plastic material, e.g. a polymer, or any other plastic material suitable to provide the housing 102. According to various embodiments, the housing 102 may include metal and plastic materials.

Further, as illustrated in FIG. 1A, the frame cassette 100 may include a robotic handling flange 104 coupled to the top cover 102. The dimensions of the housing 102 or the frame cassette 100 may be defined by the according SEMI standard, as already described, so that the frame cassette 100 can match to the corresponding load port of processing equipment or a processing tool.

As already described, the mounting structure 106 may be configured in accordance with the SEMI® standard to receive (or to host) a plurality of tape-frames, e.g. 13 or 25 tape-frames 108. According to various embodiments, the frame cassette 100 may include a frame support for a plurality of tape-frames and a frame restraint.

According to various embodiments, the frame cassette 100 may include human handles at opposite side covers of the housing 102 or at the top cover 102*t* of the housing 102.

FIG. 1B illustrates a frame cassette 100, according to various embodiments, with an inserted tape-frame 108. The tape-frame 108 may be inserted through the opening in the housing 102. The design of the interior of the housing 102 and the mounting structure 106 may comply with the corresponding SEMI® standard for frame cassettes to provide an accurate tape-frame 108 handling.

As already described, according to the SEMI® standard the housing 102 and the mounting structure 106 may be configured to receive 13 or 25 tape-frames 108. However, the frame cassette 100 may be adapted to receive a different number of tape-frames 108, e.g. more than 25 or less than 25, e.g. less than 13.

FIG. 1C illustrates a frame cassette 100, according to various embodiments, wherein the door 102*d* of the frame cassette 100 is closed or mounted. Illustratively, FIG. 1C shows a sealed housing 102 or a sealed frame cassette 100 described herein. The door 102*d* may include two latch key holes 112*a*, 112*b* such that the door can be opened and closed via a latch key according to SEMI® standards, e.g. E62-1106 and E47.1.

According to various embodiments, the locking mechanism for the door 102*d* may include a latch key, a cam, and a latch bar such that the door 102*d* can be closed via rotating the latch key, wherein the latch bar is latched into the housing 102. The door locking mechanism may be operated by the processing equipment or the processing tool, e.g. when the frame cassette 100 is positioned at the load port. Illustratively, the processing equipment or the processing tool may include a door handling system for opening and closing the door 120*d* of the frame cassette 100.

In analogy to FIGS. 1A to 1C, FIGS. 2A to 2C respectively illustrate the frame cassette 100 in a schematic view from the bottom. According to various embodiments, the frame cassette 100 may have one or more than one, e.g. three or six, kinematic couplings 110*a*, 110*b*, 110*c* disposed at the bottom plate 102*b* of the frame cassette 100. The kinematic couplings 110*a*, 110*b*, 110*c* of the frame cassette 100 may match to kinematic coupling pins at the processing equipment or at the processing tool or the load port of the processing equipment or the processing tool (cf. FIG. 5). According to various embodiments, the kinematic couplings 110*a*, 110*b*, 110*c* of the frame cassette 100 may allow an alignment of the frame cassette 100 to a load port, to a nest on a vehicle or in a stocker. The kinematic couplings 110*a*, 110*b*, 110*c* may be configured to provide a lead-in capability for correcting a misalignment between the frame cassette 100 and a load port along a horizontal direction while landing the frame cassette 100 on the load port.

Figure 2A:
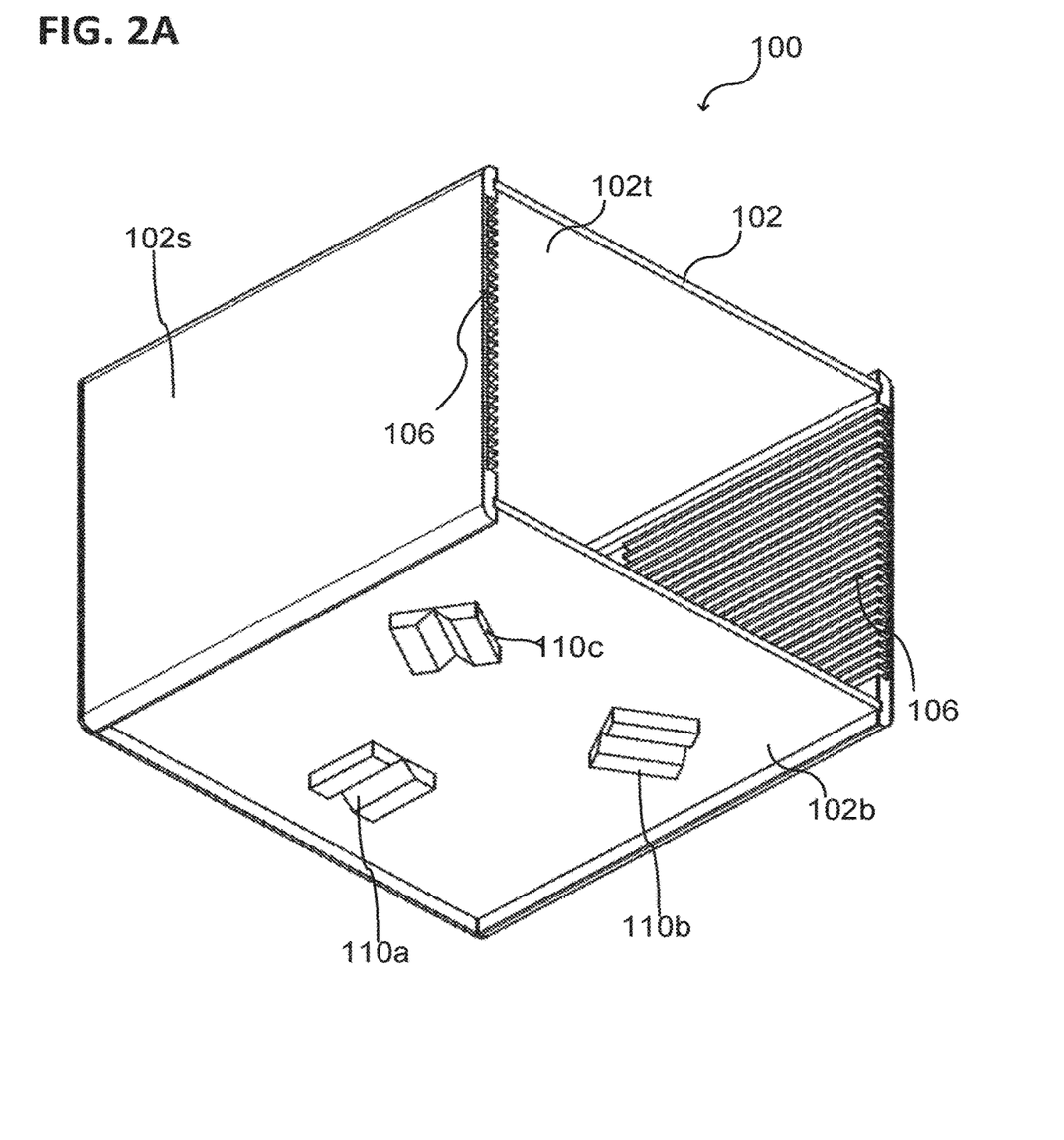
FIGS. 2A to 2C show respectively a frame cassette in a schematic perspective view from underneath, according to various embodiments.
Figure 2B:
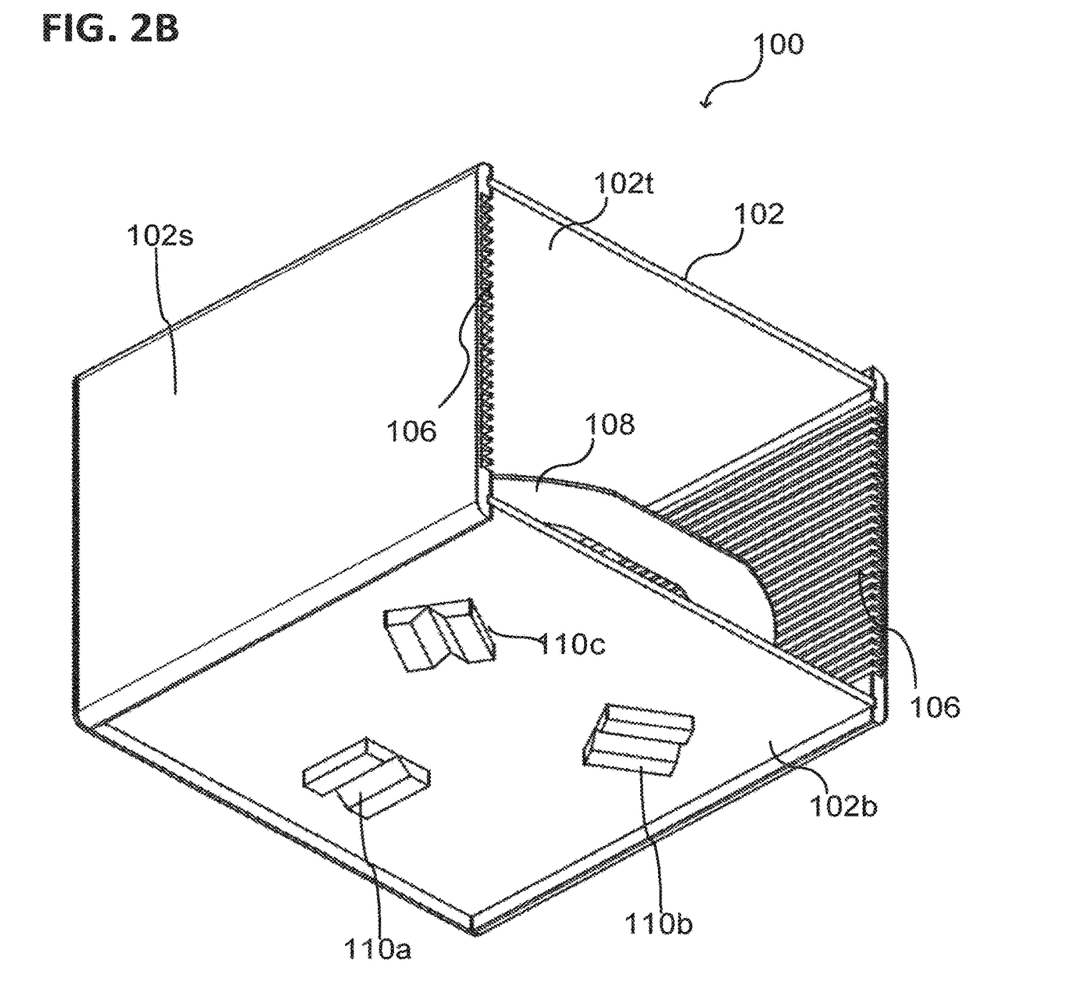
Figure 2C:
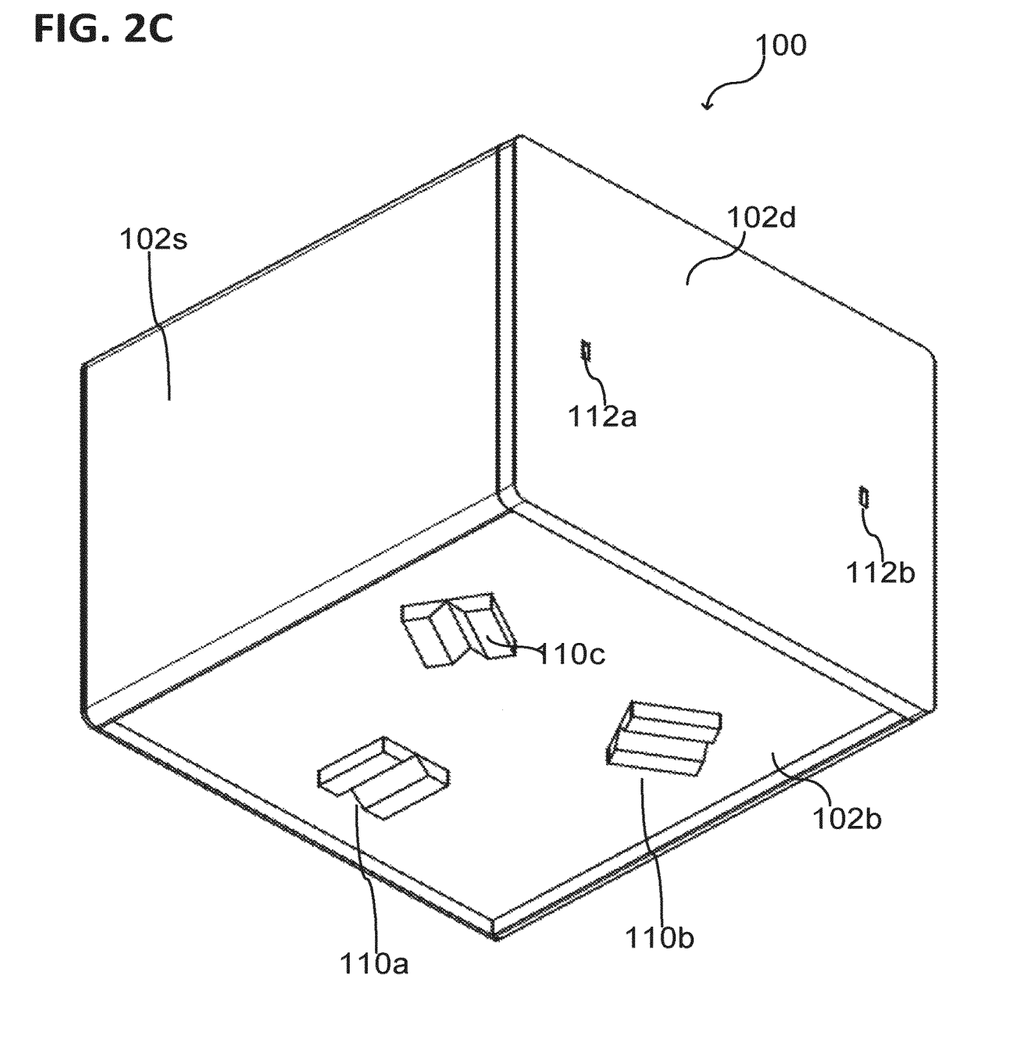

According to various embodiments, the frame cassette 100 may further include a frame-restraint, e.g. at least one feature that prevents the tape-frames 108 from slipping out of the frame cassette 100 or the slipping of the tape-frames 108 against the closed door 102*d* during the transport of the frame cassette 100.

According to various embodiments, the frame cassette 100 may include a cassette stacking, e.g. at least one feature that allows stacking a plurality of frame cassettes 100 over each other. According to various embodiments, the frame cassette 100 may include two bottom rails on the bottom 102*b* of housing 102, e.g. one on each side, such that the frame cassette 100 can be transported via a roller conveyor.

According to various embodiments, the frame cassette 100 may include one or more than one carrier sensing pads at the bottom of the housing 102.

According to various embodiments, the door 102*d* of the frame cassette 100 may include one or more registration pin holes being used to properly position the door relatively to the door opening system.

According to various embodiments, the frame cassette 100 may include automated key slots being used for automated actuation of the door latches. The door 102*b* may be opened, closed, and moved (operated) via keys being inserted into the key slots 112*a*, 112*b*. The keys being inserted into the key slots 112*a*, 112*b* may be rotated thereby moving the door latches to open and close the door 102*d*.

Figure 3B:
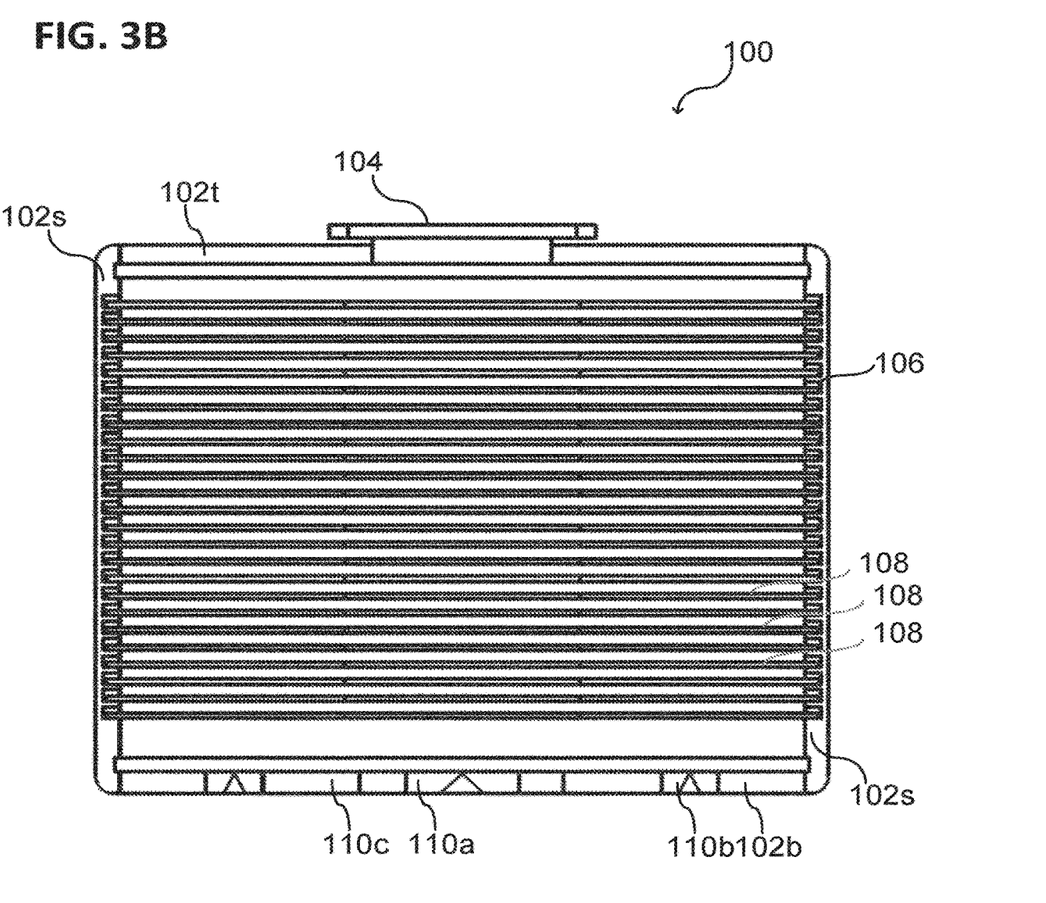

FIG. 3A shows the frame cassette 100 in a front view including a detailed view of the mounting structure 106. According to various embodiments, the mounting structure 106 may include a plurality of tape-frame slots 106*a* to respectively receive a tape-frame 108, as for example illustrated in FIG. 3B.

According to various embodiments, the height 106*h* of a tape-frame slot 106*a* may be in the range from about 5 mm to about 15 mm. Alternatively, the height 106*h* of a tape-frame slot 106*a* may be adapted to the respective tape-frame 108 to be inserted into the tape-frame slot 106*a*. The tape-frame slots 106*a* may be provided by a recess structure within the side covers 102*s* of the housing 102 of the frame cassette 100. Alternatively, the tape-frame slots 106*a* may be provided by a mounting structure 106 being inserted into the housing 102 of the frame cassette 100. In other words, the mounting structure 106 may be provided via a recess structure in at least two side covers 102s of the housing 102.

Figure 4A:
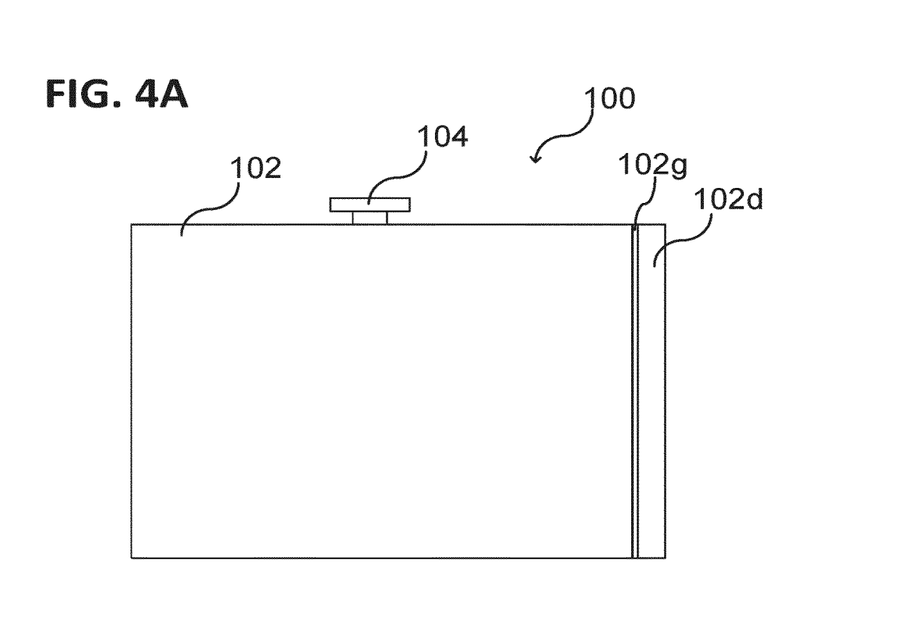
FIGS. 4A and 4B show respectively a frame cassette having a sliding door mechanism in a schematic view from the side, according to various embodiments.
Figure 4B:
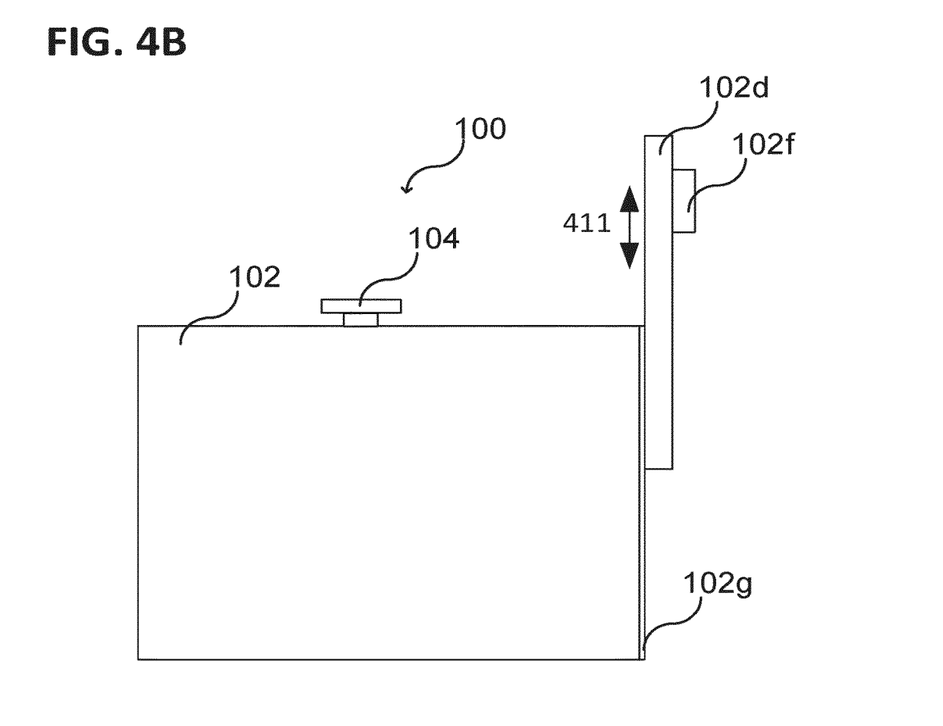

FIG. 4A and FIG. 4B show respectively a frame cassette 100 in a side view, according to various embodiments, wherein the frame cassette 100 may include a door movement mechanism for vertically sliding 411 the door 102d to open and close the door 102d of the frame cassette 100. Further, according to various embodiments, the frame cassette 100 may include a gasket 102g surrounding the opening the housing 102 such that the door 102d can seal the housing 102 of the frame cassette 100 when the door 102d is closed, e.g. air-tightly.

According to various embodiments, the door mechanism may be designed such that the door 102d can be mounted with one or more latches and/or one or more grooves (the grooves may be formed for example in the side covers (e.g. the sidewalls) 102s of the housing 102) and such that the door may be opened vertically in a fully automatic operation. According to various embodiments, the door may be slided 411 via one or more door guide rails for opening and closing the door 102d. According to various embodiments, the door mechanism may be designed as a self-locking mechanism, wherein the locking may be for example ensured via one or more bolts and/or one or more springs.

According to various embodiments, if the door 102d is closed, the door may not necessarily seal the housing 102 hermetically. In this case, the door 102d may at least protect the interior of the housing 102 from particles. According to various embodiments, hermetically sealed applications of the frame cassette 100 may be enabled via seals or a gasket at the door 102d or at the housing 102, e.g. at the front side of the housing 102.

Alternatively, according to various embodiments, the sliding door 102d may be built-in in the fully automatic transport system, e.g. in a Murata system or in a similar transport system. Illustratively, at the moment of the touchdown of the frame cassette 100 on the processing equipment (e.g. the frame cassette 100 including a plurality of wafers mounted on tape-frames 108), the door 102d may be removed and taken over by the transport system, or the door 102d may be removed and may remain at the transport system. During the lifting of the frame cassette 100, the door 102d may fall back by gravity or the door 102d is closed automatically.

According to various embodiments, as illustrated in FIG. 4B, the door 102d may include a door handling flange 102f such that the door 102d can be operated manually, e.g. by an operator, or such that the door 102d can be operated via the transport system in a fully automated design.

Figure 5:
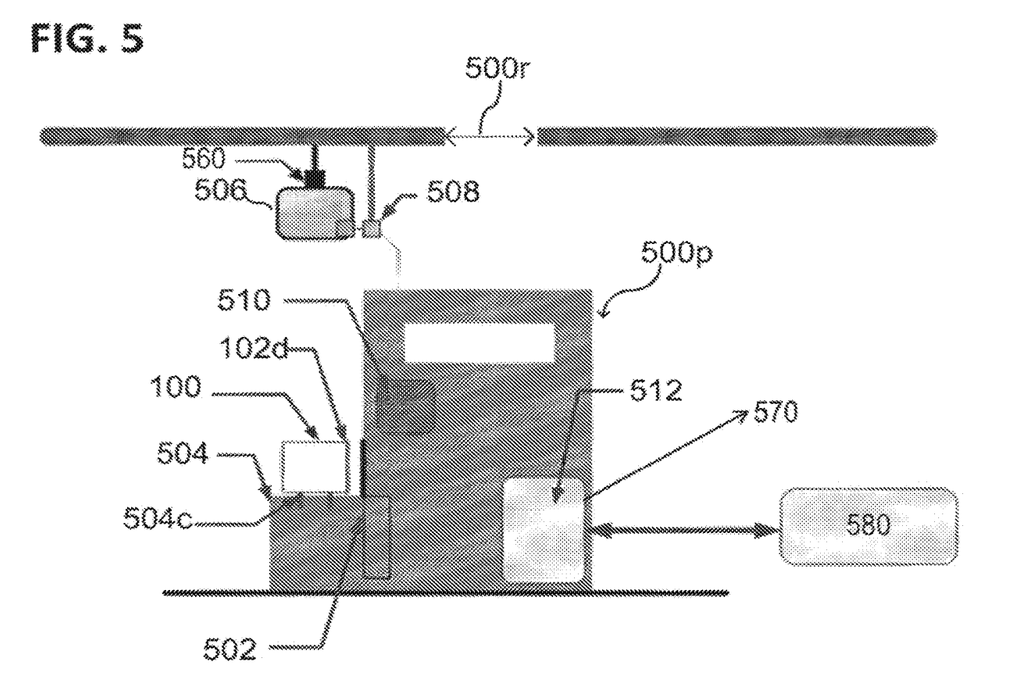
FIG. 5 shows an automatic transportation system for a frame cassette in a schematic view, according to various embodiments.

According to various embodiments, the frame cassette 100 may be landed on the load port 504 (tool load port) of a processing tool 500p (equipment) via an overhead transportation system 506 (OHT) (e.g. including a rail 500r at the ceiling of a fab), as shown for example in FIG. 5, wherein the door 102d of the frame cassette 100 may remain within the OHT 506 (not shown) when the frame cassette 100 is open.

Alternatively, according to various embodiments, the door 102d of the frame cassette 100 may be opened from the processing tool 500p, e.g. via an opener or loader 502 of the processing tool 500p. The overhead transportation system and/or the processing tool 500p may include an IR (infrared) interface 508 for data exchange. Further, the processing tool 500p may include a graphical user interface (GUI) 510 and/or a tool controller 512 for enabling automation and/or carrier management (CMS).

According to various embodiments, one or more wafers respectively adhered on a tape and mounted on a tape-frame 108 may be transported fully automated in the front end of line processing, e.g. during dicing, in a cleanroom, e.g. ISO-class 7 or better (e.g. ISO-class 2 to 6). According to various embodiments, one or more wafers respectively adhered on a tape and mounted on a tape-frame 108 may be may be transported in an air-tightly sealed frame cassette 100, e.g. during a dicing process.

According to various embodiments, the processing tool or the equipment may include a laminating tool, a dicing tool, a sawing tool, or any other tool in semiconductor processing for thin wafers, e.g. ion implantation tools, coating tools, and the like.

According to various embodiments, a frame cassette may include a housing; a mounting structure within the housing or a mounting structure inserted in the housing, the mounting structure including a plurality of tape-frame slots, each tape-frame slot configured to receive a tape-frame, wherein the housing may include an opening to introduce a tape-frame into a tape-frame slot of the plurality of tape-frame slots or to remove a tape-frame from a tape-frame slot of the plurality of tape-frame slots, a door mounted at the housing; wherein the door may be configured to close the opening of the housing to seal the interior of the housing from the exterior of the housing. According to various embodiments, the interior of the housing may be sealed air-tight or at least in such a way, that particle may be hindered to enter the interior of the housing during processing in the fab.

According to various embodiments, the housing may substantially include a prismatic shape. Further, the housing may include a bottom cover, a top cover, a rear cover and at least two side covers (e.g. three or five plated-shaped side covers).

According to various embodiments, the frame cassette may further include: a door guidance system (e.g. a door rail system) which couples the door to the housing, wherein the door guidance system may be configured to enable the movement (e.g. the vertical sliding) of the door. According to various embodiments, opening the door vertically may allow an easy space saving access to the tape-frames in the frame cassette.

According to various embodiments, the door may be configured to be operated by an overhead transportation system, e.g. via a door handling flange.

According to various embodiments, the frame cassette may further include: a gasket connected with at least one of the housing and the door, wherein the gasket may allow sealing the housing air tight when the door is closed.

According to various embodiments, the gasket may completely surround the opening in the housing. Therefore, according to various embodiments, the housing may be sealed hermetically such that cleanroom conditions may be provided and/or maintained within the housing.

According to various embodiments, the door may be bivalved to prevent particles entering the interior of the housing during opening or closing of the door.

According to various embodiments, the door may include a rotation-based release mechanism (e.g. a cam and a latch) such that the door can be disconnected form the housing and connected to the housing, wherein the door may be operated by a semiconductor processing tool.

According to various embodiments, the frame cassette may further include a transport flange (e.g. a robotic handling flange) which allows the frame cassette being transported by an overhead transport system or a robotic transport system, e.g. via a mobile vehicle.

According to various embodiments, the door and the housing may be configured such that the interior of the housing may be hermetically sealed maintaining and/or providing cleanroom conditions of ISO-class 7 or cleaner than ISO-class 7 according to the ISO-14644-1 cleanroom standard in the interior of the housing.

According to various embodiments, the tape-frames may carry semiconductor wafers having a diameter of 300 mm or a diameter of larger than 300 mm. According to various embodiments, a wafer being transported via the frame cassette may be adhered to a tape and the tape may be fixed at a tape-frame.

According to various embodiments, the housing and the mounting structure may be chemically inert.

According to various embodiments, the frame cassette may further include a valve structure to purge the housing with inert gas. According to various embodiments, the sealed housing may be evacuated, and flooded with inert gas.

According to various embodiments, the housing may include an electrostatic discharge protection or may be designed to prevent electrostatic discharge.

According to various embodiments, the frame cassette may further include one or more RFID-Tags for frame cassette identification, e.g. during automated transportation of the frame cassette 100.

According to various embodiments, the frame cassette may further include a kinematic coupling including a plurality of features to align the frame cassette to a processing tool, e.g. to a load port of a processing equipment.

According to various embodiments, the mounting structure may include 13 or 25 tape-frame slots.

According to various embodiments, the frame cassette may further include one or more human handles for manual movement of the frame cassette.

According to various embodiments, the one or more human handles may be disposed on the top-side of the housing or at the sides of the housing.

According to various embodiments, the frame cassette may further include a frame restraint preventing the hosted tape-frames slipping within or out of the housing during transportation of the frame cassette.

According to various embodiments, the frame cassette may further include bottom rails for transport of the frame cassette via roller conveyors.

According to various embodiments, the frame cassette may further include a cassette stacking for stacking two or more than two frame cassettes on top of each other.

According to various embodiments, a frame cassette may include: a housing including a plurality of tape-frame slots, each tape-frame slot of the plurality of tape-frame slots being configured to receive a tape-frame, wherein the housing may include an opening to introduce a tape-frame into a tape-frame slot of the plurality of tape-frame slots or to remove a tape-frame from a tape-frame slot of the plurality of tape-frame slots, a door connected to the housing; wherein the door is configured to close the opening of the housing to seal the interior of the housing air-tight.

According to various embodiments, a method for processing a thin wafer may include: transporting a frame cassette via an overhead transportation system from a first semiconductor processing tool to a second semiconductor processing tool.

According to various embodiments, a method for processing a wafer may include: transporting a frame cassette via a fully automated material transport system between a first semiconductor processing tool and a second semiconductor processing tool.

According to various embodiments, the frame cassette may be transported fully automated at least between a lamination tool and a dicing tool in cleanroom environment.

According to various embodiments, a method for processing a wafer may include: fully automated transporting a frame cassette hosting a plurality of tape-frames at least during the dicing processing.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A frame cassette, comprising:
a housing; and
a mounting structure within the housing, the mounting structure comprising a plurality of tape-frame slots, each tape-frame slot configured to receive a tape-frame,
wherein the housing comprises an opening configured to introduce a tape-frame into a tape-frame slot of the plurality of tape-frame slots, or to remove the tape-frame from the tape-frame slot of the plurality of tape-frame slots,
wherein the housing comprises an electrostatic discharge protection.

2. The frame cassette of claim 1, further comprising:
a door mounted at the housing, the door being configured to close the opening of the housing to seal an interior of the housing from an exterior of the housing and to be operated by an overhead transportation system.

3. The frame cassette of claim 2, further comprising:
a door guidance system mechanically connecting the door to the housing, the door guidance system being configured to guide movement of the door.

4. The frame cassette of claim 2, wherein the door comprises a door handling flange, and wherein the door is configured to be operated via the door handling flange.

5. The frame cassette of claim 2, further comprising:
a gasket connected with at least one of the housing or the door, the gasket being configured to seal the housing air-tightly when the door is closed.

6. The frame cassette of claim 5, wherein the gasket completely surrounds the opening in the housing.

7. The frame cassette of claim 2, wherein the door and the housing are configured such that an interior of the housing is hermetically sealed maintaining cleanroom conditions of ISO-class 7 or cleaner than ISO-class 7 according to the ISO-14644-1 dated 1999 cleanroom standard in the interior of the housing.

8. The frame cassette of claim 1, further comprising:
a transport flange configured to allow transport of the frame cassette via an overhead transportation system.

9. The frame cassette of claim 1, further comprising:
a valve structure configured to purge the housing with inert gas.

10. The frame cassette of claim 1, wherein the mounting structure comprises 13 or 25 tape-frame slots.

11. The frame cassette of claim 1, further comprising:
a frame restraint configured to prevent hosted tape-frames from slipping within the housing during transportation of the frame cassette.

12. The frame cassette of claim 1, further comprising:
bottom rails configured to couple the frame cassette to roller conveyors.

13. The frame cassette of claim 1, further comprising:
a cassette stacking configured to stack two or more than two frame cassettes on top of each other.

14. The frame cassette of claim 1, further comprising:
a plurality of kinematic couplings disposed at a bottom plate of the frame cassette, each kinematic coupling configured to match a kinematic coupling pin at a processing equipment or at a processing tool or a load port of the processing equipment or the processing tool.

15. The frame cassette of claim 1, wherein each tape-frame slot is a recess in a side cover of the housing.

16. The frame cassette of claim 1, wherein the electrostatic discharge protection comprises dielectric materials configured to avoid electrical breakdown.

17. An automatic transportation system, comprising:
a first semiconductor processing tool;
a second semiconductor processing tool;
a frame cassette comprising a housing and a mounting structure within the housing, wherein the mounting structure comprises a plurality of tape-frame slots, each tape-frame slot configured to receive a tape-frame, wherein the housing comprises an opening configured to introduce a tape-frame into a tape-frame slot of the plurality of tape-frame slots, or to remove the tape-frame from the tape-frame slot of the plurality of tape-frame slots, wherein the housing comprises an electrostatic discharge protection; and
an overhead transportation system configured to transport the frame cassette from the first semiconductor processing tool to the second semiconductor processing tool.

18. The automatic transportation system of claim 17, wherein the frame cassette further comprises a door mounted at the housing, and wherein the door is configured to close the opening of the housing to seal an interior of the housing from an exterior of the housing and to be operated by the overhead transportation system.

19. The automatic transportation system of claim 18, wherein the frame cassette further comprises a door guidance system mechanically connecting the door to the housing, and wherein the door guidance system is configured to guide movement of the door.

20. The automatic transportation system of claim 18, wherein the door comprises a door handling flange, and wherein the door is configured to be operated via the door handling flange.

21. The automatic transportation system of claim 17, wherein the frame cassette further comprises a kinematic coupling comprising at least one feature configured to align the frame cassette to a load port of the first or the second semiconductor processing tool.

22. A method of automatic transportation of semiconductor wafers, the method comprising:
loading a plurality of tape-frames into a frame cassette, each tape-frame including a tape which adheres a semiconductor wafer to the tape-frame, the frame cassette comprising a housing and a mounting structure within the housing, wherein the mounting structure comprises a plurality of tape-frame slots, each tape-frame slot configured to receive a tape-frame of the plurality of tape-frames, wherein the housing comprises an opening for loading the plurality of tape-frames into the frame cassette, wherein the housing comprises an electrostatic discharge protection; and
transporting the frame cassette from a first semiconductor processing tool to a second semiconductor processing tool via an overhead transportation system.

* * * * *

UNITED STATES PATENT AND TRADEMARK OFFICE
CERTIFICATE OF CORRECTION

PATENT NO. : 11,594,439 B2
APPLICATION NO. : 16/009843
DATED : February 28, 2023
INVENTOR(S) : G. Schneider et al.

It is certified that error appears in the above-identified patent and that said Letters Patent is hereby corrected as shown below:

On the Title Page

Item (57) Abstract, Line 7, please change "tape frame" to -- tape-frame --

Signed and Sealed this
Sixteenth Day of May, 2023

Katherine Kelly Vidal
*Director of the United States Patent and Trademark Office*